United States Patent
Morikawa et al.

(10) Patent No.: US 6,771,486 B2
(45) Date of Patent: Aug. 3, 2004

(54) STORAGE CELL FOR SURFACE MOUNTING

(75) Inventors: Koichi Morikawa, Kyoto (JP); Masashige Ashizaki, Hirakata (JP); Hideki Imai, Uji (JP); Masayuki Shinjou, Uji (JP)

(73) Assignee: Matsushita Electric Industrial Co., Ltd. (JP)

(\*) Notice: Subject to any disclaimer, the term of this patent is extended or adjusted under 35 U.S.C. 154(b) by 0 days.

(21) Appl. No.: 10/436,459

(22) Filed: May 13, 2003

(65) Prior Publication Data

US 2003/0235087 A1 Dec. 25, 2003

(30) Foreign Application Priority Data

May 13, 2002 (JP) .................................. 2002-136662
Jan. 10, 2003 (JP) .................................. 2003-004457

(51) Int. Cl.$^7$ ................................................ H01G 9/00
(52) U.S. Cl. ..................... 361/502; 361/508; 361/516
(58) Field of Search ................................. 361/502, 508, 361/510, 512, 516, 517, 519, 513, 541

(56) References Cited

U.S. PATENT DOCUMENTS 5,959,830 A \* 9/1999 Inagawa et al. ............ 361/502
6,433,997 B1 \* 8/2002 Noguchi et al. ............ 361/511

\* cited by examiner

*Primary Examiner*—Anthony Dinkins
(74) *Attorney, Agent, or Firm*—Parkhurst & Wendel, L.L.P.

(57) ABSTRACT

As a storage cell for surface mounting which reduces the mounting area, increases the reliability of soldering and realizes high-density mounting, provided is a storage cell for surface mounting having: a polar storage cell housing a component between a case and a top cover and sealed with an insulator; an anode terminal connected to an outer surface of the case; and a cathode terminal connected to an outer surface of the top cover. In this storage cell, the anode terminal is provided with an external connection connected to a printed wiring board, the cathode electrode is provided with a mounting-fixing portion connected to an external connection connected to the printed wiring board and the top cover, and a plated layer is formed on the external connections of the anode terminal and cathode terminal and on the mounting-fixing portion of the cathode terminal.

9 Claims, 9 Drawing Sheets

PRIOR ART

FIG. 9
PRIOR ART

STORAGE CELL FOR SURFACE MOUNTING

FIELD OF THE INVENTION

The present invention relates to a storage cell for surface mounting for use in various types of electronic devices and, more particularly, to a horizontal-type storage cell for surface mounting which is suitable for high-density mounting on a printed wiring board.

BACKGROUND OF THE INVENTION

There are an electric double layer capacitor, a button battery and the like as storage cells for surface mounting. In an electric double layer capacitor, for example, as is apparent from an outline of its configuration shown in FIG. 7, a pair of electric double layer electrodes 41a, 41b are disposed to oppose to each other through an insulating separator 44 and housed in a twofold metal container. In this pair of electric double layer electrodes, polarizable electrodes 43a, 43b each of an activated carbon layer are formed on disk-like sheets (or foil) 42a, 42b each of valve metal. The disk-like sheet (or foil) 42a of valve metal is bonded to the inner surface of a top cover 46 of the metal container and the disk-like sheet (or foil) 42b of valve metal is bonded to the inner surface of a case 45 of the metal container.

Figure 7:
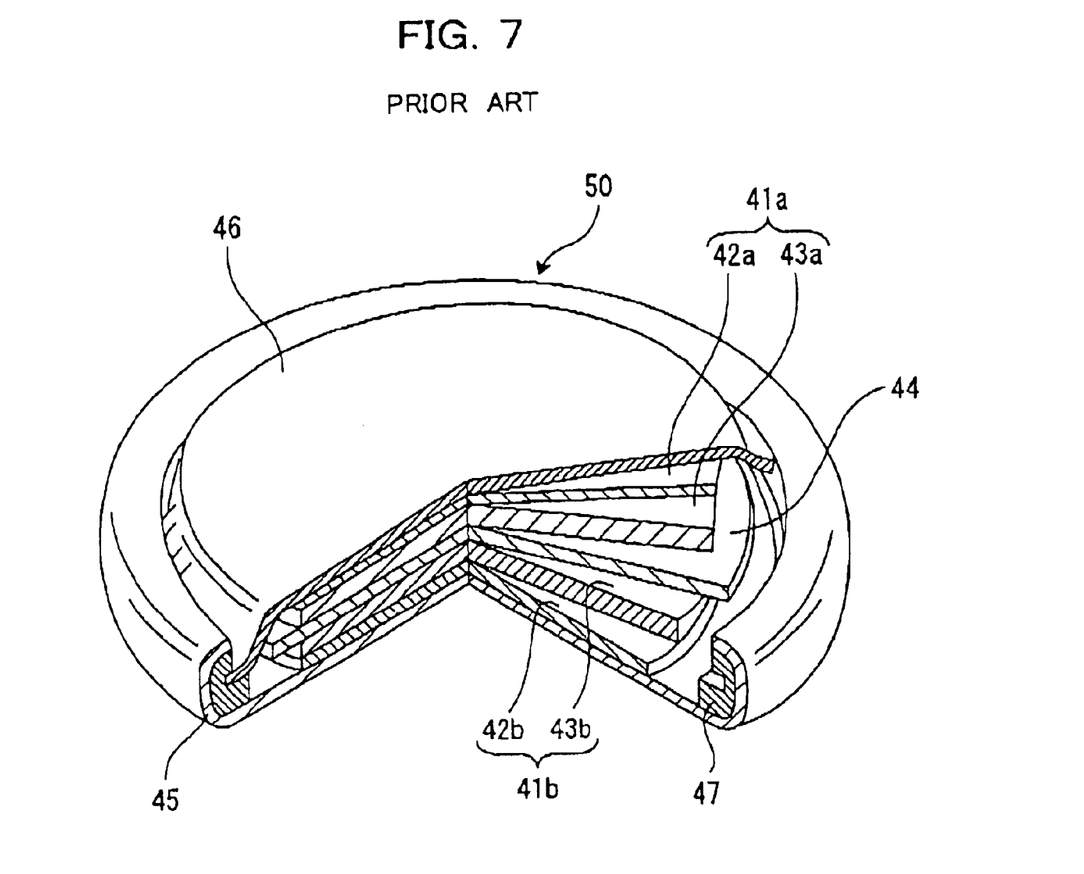
FIG. 7 is a partially cutaway perspective view showing a configuration of a conventional electric double layer capacitor.

The case 45 and the top cover 46 are bonded together in a hermetically sealed manner, with a ring packing 47 interposed in a marginal area of the two, and a nonaqueous electrolyte (not shown) is charged into the interior of the metal container so as to fill up the electric double layer electrodes 41a, 41b and the separator 44.

Figure 8A:
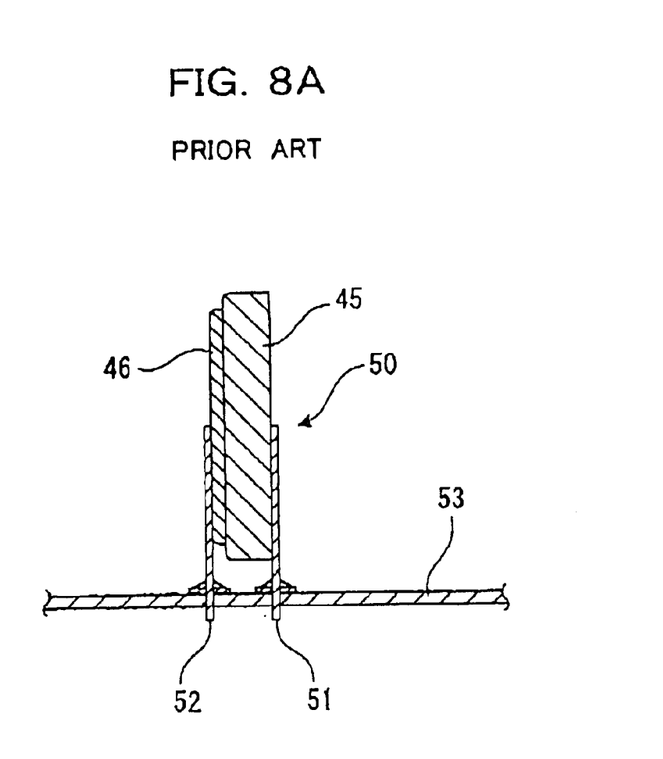
FIG. 8A is a sectional view of a conventional coin-shaped storage cell vertically placed on a printed wiring board and mounted by soldering.
Figure 8B:
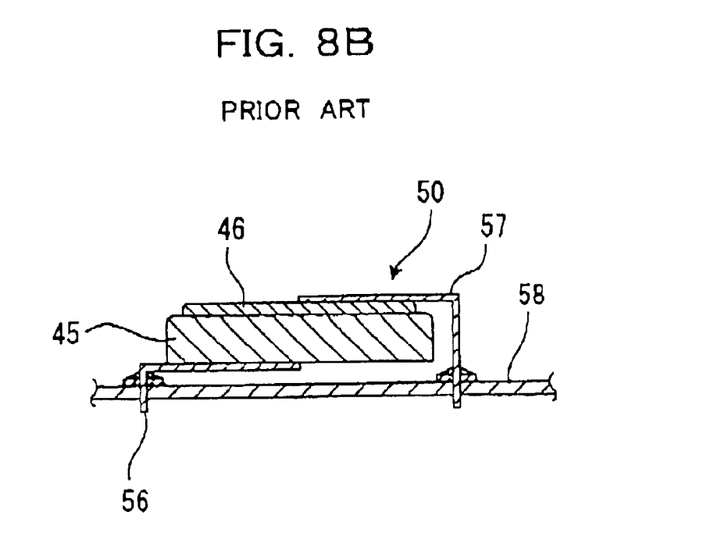
FIG. 8B is a sectional view of a conventional coin-shaped storage cell horizontally placed on a printed wiring board and mounted by soldering.

A coin-shaped electric double layer capacitor 50 configured as described above is mounted on a printed wiring board, 53, 58 as shown in FIGS. 8A and 8B. FIG. 8A shows the coin-shaped electric double layer capacitor 50 vertically mounted on a substrate 53. External lead terminals 51, 52 are connected to the outer surface portions of the case 45 and top cover 46, respectively, of the electric double layer capacitor 50, and the external lead terminals 51, 52 are inserted into holes of the printed wiring board 53 and these portions are soldered. Also, FIG. 8B shows the coin-shaped electric double layer capacitor 50 horizontally mounted on the substrate 58. External lead terminals 56, 57 are connected to the outer surface portions of the case 45 and top cover 46, respectively, of the electric double layer capacitor 50, and the external lead terminals 56, 57 are inserted into holes of the printed wiring board 58 and these portions are soldered.

Figure 9:
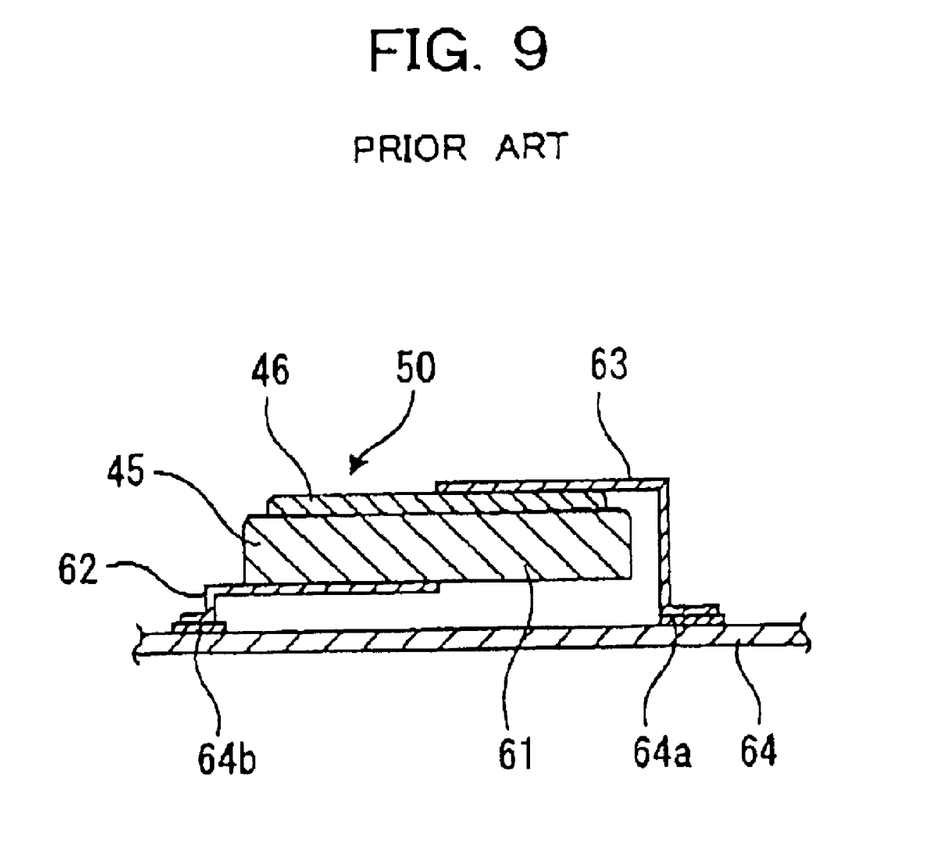
FIG. 9 is a sectional view of a conventional storage cell for surface mounting which is placed on a printed wiring board and mounted by soldering.

In addition to such a mounting method as described above, there is a method by which external lead terminals 62, 63 are connected to the outer surfaces of the case 45 and top cover 46 of the electric double layer capacitor 50, and the respective leading end portions of the external lead terminals 62, 63 kept parallel to the land surfaces 64a, 64b of a printed wiring board 64 are soldered by the reflow process.

On the other hand, also in a button battery, electrodes each having a separator interposed between a positive pole and a negative pole are housed in a twofold metal container and the external structure of this button battery is similar to that of the above-described electric double layer capacitor 50.

However, when a storage cell, such as an electric double layer capacitor and a button battery of the above-described configuration, is amounted on a printed wiring board for high-density mounting, the mounting height is large in a vertical type and the mounting area is large in a horizontal type, thus posing problems.

In a printed wiring board for high-density mounting, parts are mounted on both the front and back surfaces thereof. Therefore, after parts have been mounted on the front surface, these parts are caused to undergo displacement when the back surface of the printed wiring board is mounted with parts, with the result that problems such as poor contact or falling off of the parts may sometimes arise.

For this reason, large parts such as a coin-shaped storage cell are subjected to the reflow process after they are fixed onto a printed wiring board by use of an adhesive, posing a problem that the process becomes complicated.

Furthermore, in a case where a plurality of storage cells for surface mounting are connected in series, conventionally, a plurality of storage cells for surface mounting are inserted in a stacked manner into a case having a shape of cylinder, polygonal cylinder or the like, and the storage cells are brought into contact with each other under pressure by use of an electrically conductive elastic member such as a spring plate. Therefore, problems such as poor conductivity arose when an upsized substrate was used for mounting parts thereon, or when an urging force of an electrically conductive elastic member such as a spring plate is insufficient.

In order to solve such problems, it was conceivable to caulk a case having a plurality of storage cells for surface mounting inserted in a stacked state. However, if pressure for caulking increases, excessive stresses are applied to the storage cells and an electrolyte may leak. Thus, in view of reliability, it was difficult to introduce this method.

The present invention was made to solve such conventional problems and has as its object to provide a storage cell for surface mounting which can reduce the mounting area and increase the reliability of soldering even when high-density mounting is performed on a printed wiring board.

DISCLOSURE OF THE INVENTION

According to a first aspect of the invention, there is provided a storage cell for surface mounting, which includes: a polar storage cell having a component composed of a pair of electrodes and an insulative separator interposed between the pair of electrodes, the component being housed between a case disposed on an anode side of the component and a top cover disposed on a cathode side of the component and being sealed with an insulator; an anode terminal which is connected to an outer surface of the case; and a cathode terminal which is connected to an outer surface of the top cover. In this storage cell for surface mounting, the anode terminal is provided with an external connection which is connected to a printed wiring board, the cathode terminal is provided with an external connection which is connected to the printed wiring board and a fixing portion for mounting (or a mounting-fixing portion) which is connected to the top cover, and a plated layer is formed on the external connections of the anode terminal and cathode terminal and on the mounting-fixing portion of the cathode terminal. Because in mounting the storage cell for surface mounting on a printed wiring board, the mounting-fixing portion of the cathode terminal is also connected to a dummy land portion provided in the printed wiring board at the same time with each external connection, it is possible to reduce defects such as displacement and a short circuit caused by displacement even when the reflow process is performed after the mounting of the storage cell for surface mounting, and it is also possible to increase the reliability of soldering because each external connection has a plated layer.

In this first aspect of the invention, it is preferred that the plated layers formed in the external connections of the anode terminal and cathode terminal and the mounting-fixing portion of the cathode terminal be provided on the side where the storage cell for mounting is connected to the printed wiring board or on both sides.

Further, in the first aspect of the invention, the mounting area for mounting the storage cell for surface mounting on the printed wiring board can be reduced by arranging the anode terminal and the cathode terminal so that the external connection formed by bending one end of the anode terminal and the external connection of the cathode terminal are position in parallel in the same direction.

Further, in the first aspect of the invention, by positioning the mounting-fixing portion in the center of the top cover, the storage cell for surface mounting can be positively fixed to the printed wiring board, and the displacement and falling off of the storage cell can be reduced also in the later solder reflow process.

Further, in the first aspect of the invention, when a hole is cut out in the center of the mounting-fixing portion, a solder fillet is formed in the hole when the storage cell for surface mounting is connected to the printed wiring board and the strength of a soldered portion is increased, with the result that the reliability of soldering of the external connections can be further increased.

Furthermore, in the first aspect of the invention, when the plated layer is a tin-plated layer, the external connections and mounting-fixing portion can be easily mounted on the printed wiring board and hence connection of high reliability can be realized.

According to a second aspect of the invention, there is provided a storage cell for surface mounting comprising a plurality of polar storage cells laminated in series through a connection member, wherein an end of an anode terminal and an end of a cathode terminal are connected respectively to an anode terminal portion and a cathode terminal portion which provide both ends of the laminated polar storage cells, and the other end of the anode terminal and the other end of the cathode terminal are disposed on a same plane. Therefore, it is possible to realize a storage cell for surface mounting which ensures miniaturization and improvement in the reliability of bonding with a simple configuration and which enables high-density mounting on a printed wiring board to be performed.

Further, in the second aspect of the invention, when the connection member has a concave longitudinal sectional shape, the cathode of the polar storage cell is bonded to an outer bottom surface of the connection member and the anode of the polar storage cell is bonded to at least part of an inner circumferential surface of the connection member, then miniaturization can be achieved with a simple configuration and the reliability of bonding to the printed wiring board can be improved.

Further, in the second aspect of the invention, when one of the anode terminal connected to the anode of the laminated polar storage cells and the cathode terminal connected to the cathode is formed to be roughly linear and the other is bent into a channel shape, the miniaturization of the storage cell for surface mounting can be achieved with a simple configuration and high-density surface mounting can be performed with a minimum area.

Furthermore, in the second aspect of the invention, when an opening is formed in an area of the anode terminal or cathode terminal bent into the channel shape, the area being in contact with an outer peripheral surface of the polar storage cell, it is possible to increase the adhesion between the storage cell and the anode terminal or cathode terminal, and it becomes possible to form a solder fillet when the storage cell for surface mounting is mounted on the printed wiring board. Therefore, the reliability of the mounting state can be improved and it becomes possible to easily check a solder fillet in a post-mounting inspection.

As described above, according to the present invention, there is provided a storage cell for surface mounting, which comprises: a polar storage cell having a component composed of a pair of electrodes and an insulative separator interposed between the pair of electrodes, the component being housed between a case disposed on an anode side of the component and a top cover disposed on a cathode side of the component and being sealed with an insulator; an anode terminal which is connected to an outer surface of the above-described case; and a cathode terminal which is connected to an outer surface of the above-described top cover. In this storage cell for surface mounting, the anode terminal is provided with an external connection which is connected to a printed wiring board, the cathode terminal is provided with an external connection which is connected to the printed wiring board and a mounting-fixing portion which is connected to the top cover, and a plated layer is formed on the external connections of the anode terminal and cathode terminal and on the mounting-fixing portion of the cathode terminal. With this configuration, in mounting the storage cell for surface mounting on a printed wiring board, the fixing portion for mounting the cathode electrode can be connected to a dummy land portion provided in the printed wiring board, therefore, it is possible to reduce defects such as displacement and a short circuit caused by displacement even in the mounting reflow process after the storage cell for surface mounting has been mounted, and it is also possible to increase the reliability of soldering because each connection terminal has a plated layer. Thus the above advantages are obtained.

Furthermore, there is provided a storage cell for surface mounting, which comprises a plurality of polar storage cells laminated in series through a connection member, wherein an end of an anode terminal and an end of a cathode terminal are connected respectively to an anode and a cathode which provide both ends of the laminated polar storage cells, and the other end of the anode terminal and the other end of the cathode terminal are disposed on a same plane. Therefore, it is possible to realize a storage cell for surface mounting which ensures miniaturization and improvement in the reliability of bonding with a simple configuration without the need to use a dedicated case or the like, and which enables high-density mounting on a printed wiring board to be performed.

DESCRIPTION OF THE EMBODIMENTS

The embodiments of the present invention will be described below with reference to the attached drawings.

Embodiment 1

Figure 1:
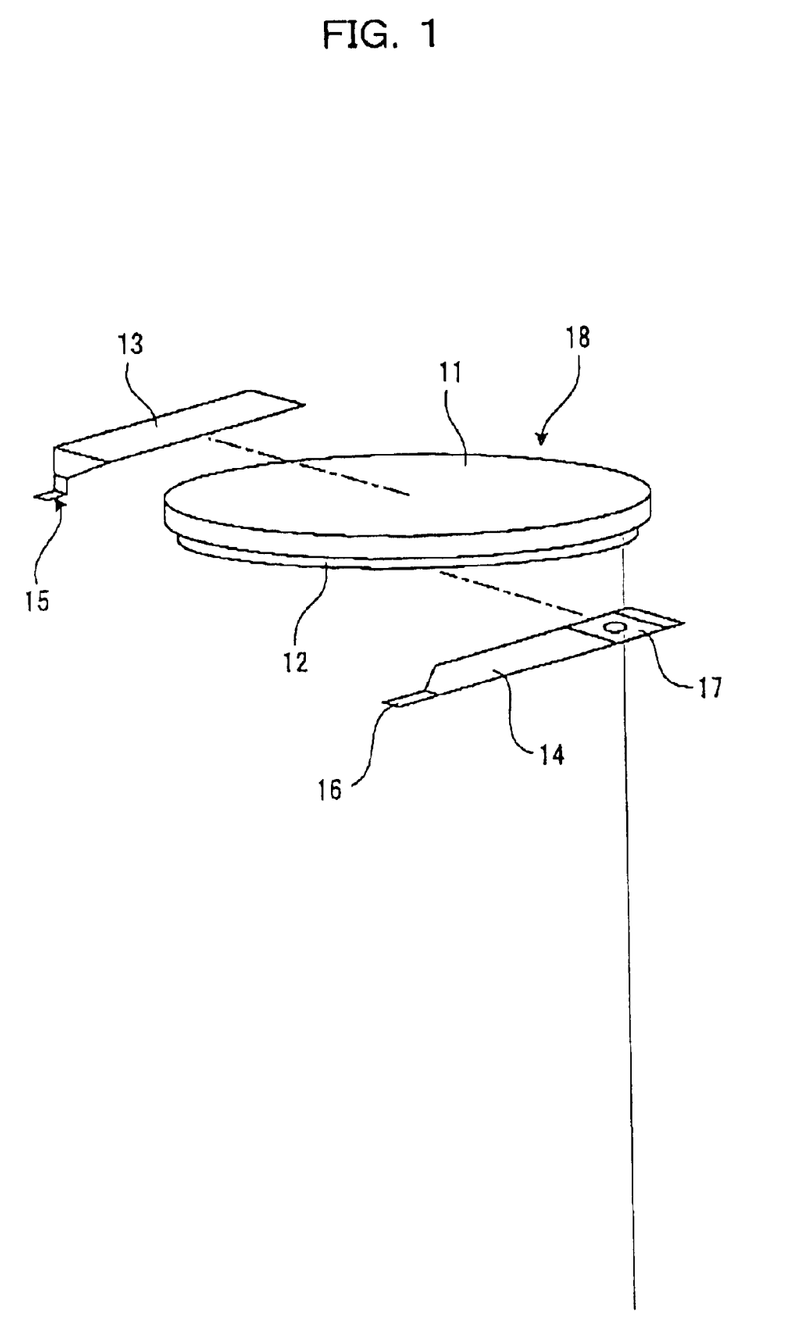
FIG. 1 is a partially exploded perspective view, showing the configuration of a storage cell for surface mounting in Embodiment 1 of the invention.
Figure 2A:
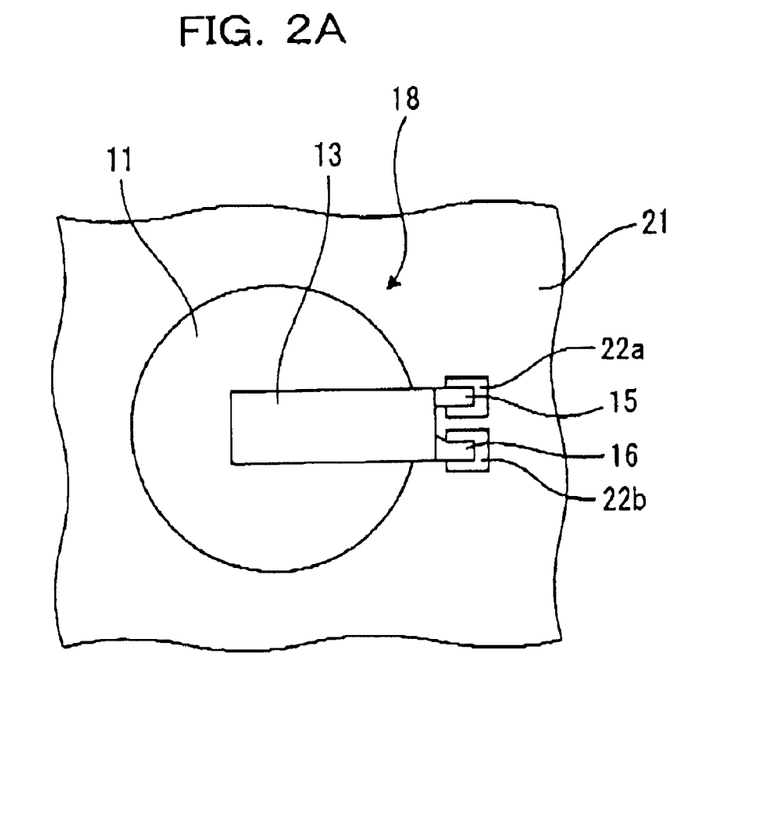
FIGS. 2A and 2B are a plan view and a sectional view, respectively, of the storage cell mounted on a printed wiring board according to Embodiment 1 of the invention.
Figure 2B:
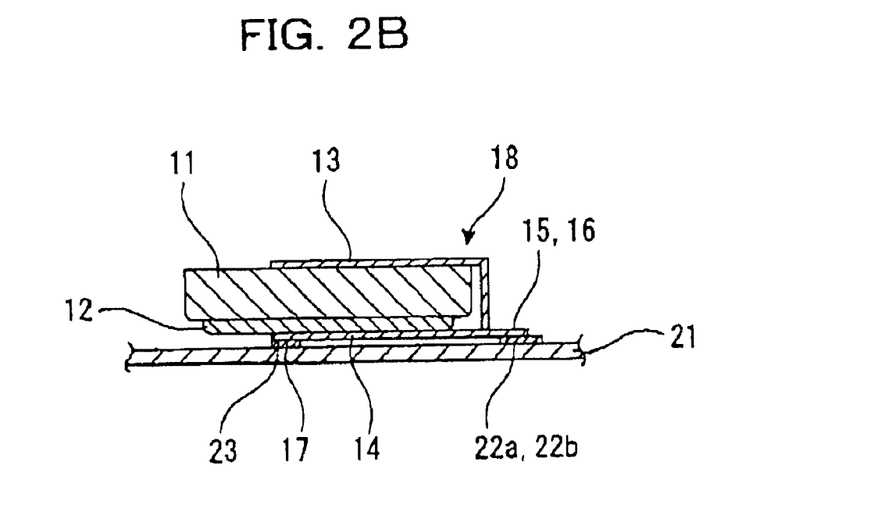

FIGS. 1 to 3 show Embodiment 1 of the invention.

FIG. 1 shows a storage cell for surface mounting 18 in Embodiment 1.

Between a case 11 disposed on the anode side and a top cover 12 disposed on the cathode side is housed a component (not shown) in such a manner that a pair of electrodes are arranged so as to be opposed to each other through an insulating separator, and the case 11 and the top cover 12 are sealed through an insulating ring packing (not shown) to form a polar storage cell.

An external connection 15 is formed in part of an anode terminal 13 connected to an outer surface of the case 11 and an external connection 16 is formed in a cathode terminal 14 connected to the top cover 12. A plated layer is formed on each of the external connection 15 and external connection 16. Furthermore, on the cathode 14 a mounting-fixing portion 17 is formed in an area connected to the top cover 12 by laser welding etc. and a plated layer is formed on both surfaces of the mounting-fixing portion 17.

The anode terminal 13 and the cathode terminal 14 are arranged in such a manner that the external connection 15 and the external connection 16 are positioned in parallel in the same direction, and the anode terminal 13 and the cathode terminal 14 are connected to an outer surface of the case 11 and an external surface of the top cover 12, respectively, to form a coin-shaped storage cell for surface mounting 18.

As shown in FIGS. 2A and 2B, the storage cell for surface mounting 18 configured as described above is arranged in such a manner that the external connection 15 of anode terminal 13 and the external connection 16 of cathode terminal 14 are respectively connected to terminal-connection land portions 22a, 22b formed in a printed wiring board 21 and that the mounting-fixing portion 17 of the cathode terminal 14 is connected to a dummy land portion 23 provided in the printed wiring board 21. And this storage cell for surface mounting 18 is mounted on the printed wiring board 21 by soldering by use of the reflow process.

With this configuration, the mounting-fixing portion 17 of the cathode terminal 14 is also connected to the dummy land portion 23 of the printed wiring board 21 at the same time with the connection of each of the external connections 15, 16 to the terminal-connection land portions 22a, 22b of the printed wiring board 21 and, therefore, positive mounting of parts can be performed because of easy connection and besides because of connection in multiple places. Accordingly, it is possible to reduce defects such as displacement and short circuits even when the reflow process is performed after the mounting of the storage cell for surface mounting 18. It is also possible to further increase the reliability of soldering because a plated layer is formed in the external connections 15, 16.

Figure 3A:
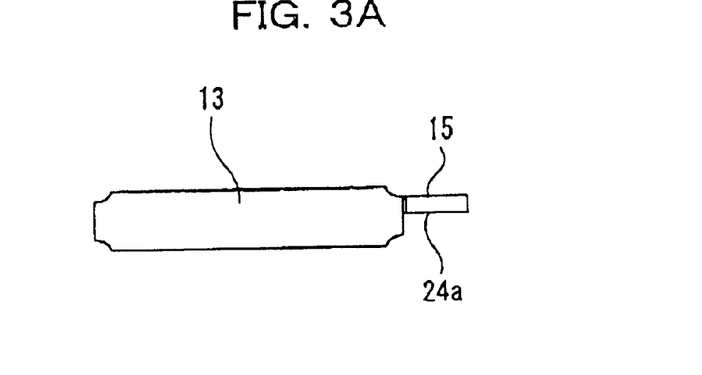
FIGS. 3A and 3B are a plan view and a sectional view, respectively, showing a configuration of an anode terminal according to Embodiment 1 of the invention.
Figure 3B:
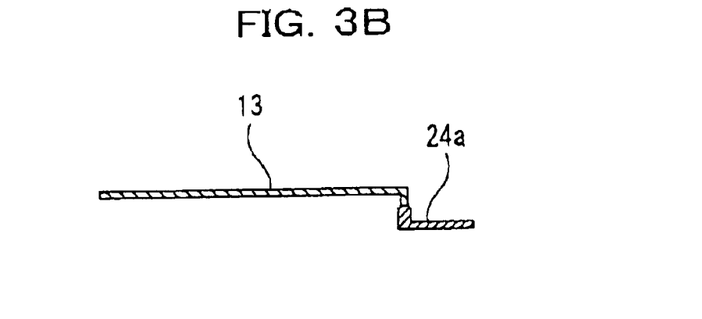
Figure 3C:
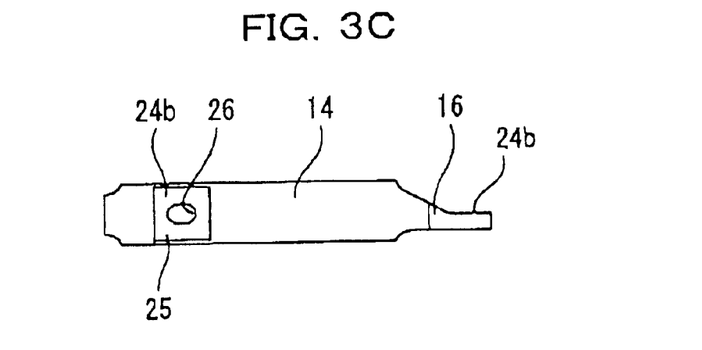
FIGS. 3C and 3D are a plan view and a sectional view, respectively, showing a configuration of a cathode terminal.
Figure 3D:
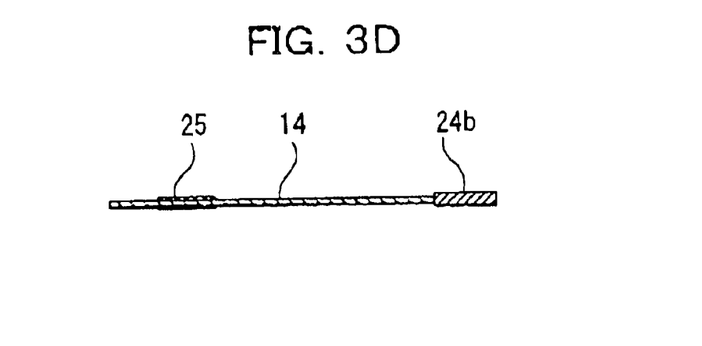

Furthermore, as shown in FIGS. 3A and 3B, the anode terminal 13 is obtained by forming the external connection 15 in such a manner that part of the anode terminal 13 is bent so that the external connection 15 becomes in the same direction as the anode terminal 13 and by forming a plated layer 24a on the external connection 15. On the other hand, as shown in FIGS. 3C and 3D. The cathode terminal 14 is obtained by forming the external connection 16 in such a manner that an opening is provided in part of an end portion of the cathode terminal 14 and by forming a plated layer 24b on the external connection 16 and mounting-fixing portion 25. Because the anode terminal 13 and cathode terminal 14 have simple shapes like this, the invention can be easily practiced.

In addition, as shown in FIG. 3C, when a hole 26 is cut out in the middle of the mounting-fixing portion of the cathode terminal 14, it becomes easy to form a solder fillet from the hole 26 during the mounting on the printed wiring board 21 and hence in the case of double side mounting, firm fixing is ensured without the displacement of the storage cell for surface mounting 18. Also, the reliability of soldering of the external connection 16 can be further improved.

When the storage cell for surface mounting 18 is to be mounted on a printed wiring board for high-density mounting, because of the application of cream solder to each land portion of the printed wiring board, it is unnecessary to perform product holding by an adhesive etc. even in the case of large parts such as the coin-shaped storage cell for surface mounting 18 and it is possible to smoothly perform the automatic mounting operations of fixing and connection to a both-side substrate.

Incidentally, in the above description, it is preferred that the plated layer 24b of the external connections 15, 16 and of the mounting-fixing portion 25 be a tin-plated layer in terms of environment and safety. However, it is also possible to use alloy plating with copper, zinc, etc. whose main component is tin.

The plated layer 24b of the mounting-fixing portion 25b may be formed on both sides or only on the side where mounting is performed.

Embodiment 2

Figure 4A:
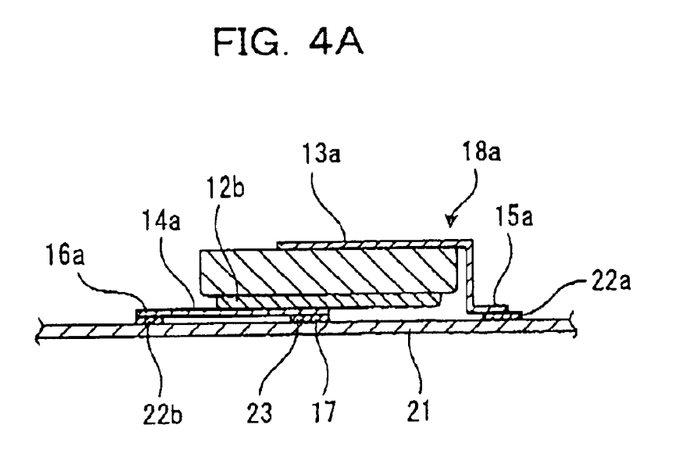
FIGS. 4A and 4B are a plan view and a sectional view, respectively, of a storage cell for surface mounting which is mounted on a printed wiring board, according to Embodiment 2 of the invention.
Figure 4B:
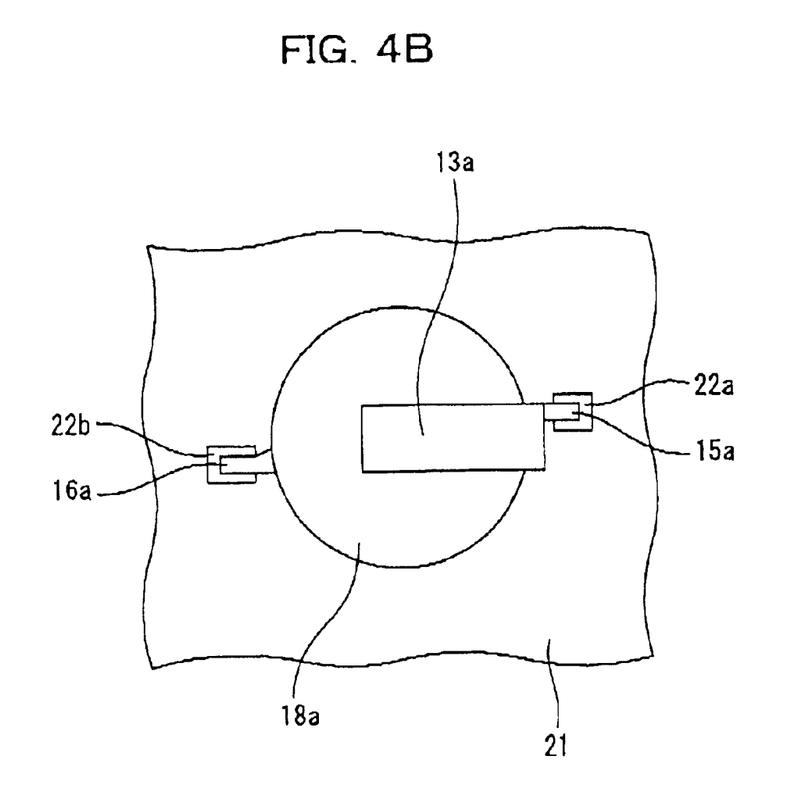

FIGS. 4A and 4B show Embodiment 2 of the invention.

Although in the above-described Embodiment 1 the anode terminal and cathode terminal were arranged so that the respective external connections of the anode terminal and cathode terminal are in the same direction, in this Embodiment 2 the external connections of the anode terminal and cathode terminal are arranged so that the respective external connections of the anode terminal and cathode terminal are in directions opposed to each other. For other points, a storage cell for surface mounting 18a was configured in the same manner as Embodiment 1. That is, the storage cell for surface mounting 18a was mounted on the printed wiring board 21 by soldering by use of the reflow process, with external connections 15a, 16a opposed to land portions 22a, 22b formed in the printed wiring board 21 and with the mounting-fixing portion 17 of the cathode terminal 14 opposed to the dummy land portion 23 provided in the printed wiring board 21.

Also in this configuration, the mounting-fixing portion 17 of the cathode terminal 14 is connected to the dummy land portion 23 provided in the printed wiring board 21 when the storage cell for surface mounting 18a is mounted on the printed wiring board 21. Therefore, even in the case of large parts such as the coin-shaped storage cell for surface mounting 18, it is possible to reduce defects such as displacement and short circuits even in the reflow process after mounting. Furthermore, it is possible to increase the reliability of soldering because the external connections 15a, 16a have a plated layer.

Incidentally, in the above Embodiments 1 and 2 the descriptions were given by taking a coin-shaped storage cell for surface mounting as an example of storage cell for surface mounting. However, the present invention is not limited to this and can also be applied to a button-shaped storage cell for surface mounting.

Embodiment 3

FIGS. 5A to 5C and FIG. 6 show Embodiment 3 of the present invention.

The numerals 31a, 31b denote coin-shaped electric double layer capacitors configured in the same way as in the above FIG. 7 which shows a conventional example. The electric double layer capacitors 31a, 31b are integrally laminated through a connection member 32 which is made of an electrically conductive material and in which a concavity 32a is formed. That is, a top cover of the electric double layer capacitors 31a is connected to an external bottom surface of the connection member 32 and an outer surface of a case of the electric double layer capacitors 31b is abutted against the inner side of the concavity 32a of the connection member 32 and fixed thereto, whereby the electric double layer capacitors 31a, 31b are integrally laminated.

An anode terminal 33 is bent into a channel shape in such a manner that one end of the anode terminal 33 reaches the anode side at an extremity of the laminated electric double layer capacitors, i.e., the case side of the electric double layer capacitor 31a and the other end reaches the cathode side at an extremity of the laminated electric double layer capacitors, i.e., the top cover side of the electric double layer capacitor 31b. Furthermore, an opening 33a is formed in the area of the anode terminal 33 which extends to the side-surface side of the electric double layer capacitors 31a, 31b. The numeral 34 denotes a cathode terminal and the shape of this cathode terminal is a rectangle.

A storage cell for surface mounting 30 configured as described above is fabricated by following the procedure given below.

First, electric double layer capacitors 31a, 31b whose assembling has been separately finished are prepared, and by use of the connection member 32 the electric double layer capacitors 31a, 31b are laminated and bonded together. On this occasion, the bottom surface of the connection member 32 is brought into close contact with the top surface of the top cover of the electric double layer capacitor 31a and bonded by performing welding by use of laser welding or resistance welding. Subsequently, the electric double layer capacitors 31b is inserted so that the outer peripheral surface of the case abuts against the inner circumferential side of the concavity 32a of the connection member 32 and welding is performed by laser welding or resistance welding from the outer peripheral surface of the connection member 32, whereby the electric double layer capacitors 31a, 31b are integrated as a piece.

And then, the anode electrode 33 is arranged so that one end thereof becomes the anode side of the electric double layer capacitor 31a and the other end becomes the cathode side of the electric double layer capacitor 31b and on the same plane as the cathode terminal 34, and the anode electrode 33 is attached to the anode side of the electric double layer capacitor 31a by performing welding by laser welding or resistance welding. The storage cell for surface mounting 30 is obtained by attaching the cathode terminal 34 to the anode side of the electric double layer capacitor 31b by performing welding by laser welding or resistance welding. In the drawing, the numeral 33b denotes a laser weld.

In this storage cell for surface mounting 30, miniaturization can be realized by such a simple configuration that an end of the anode terminal 33 extends to the cathode side by bending the anode terminal 33 into the channel shape and the mounting area can be minimized. Also, by providing the opening 33a in the area of the anode terminal 33 where the anode terminal 33 comes into contact with the outer peripheral surfaces of the electric double layer capacitors 31a, 31b, the anode terminal 33 is brought into close contact with the electric double layer capacitors 31a, 31b, whereby the mounting area can be further reduced. Moreover, in the case of mounting on a printed wiring board, it becomes possible to positively from a solder fillet between the electric double layer capacitor 31b and the opening 33a of the anode terminal 33. Incidentally, the shape of the opening formed in the anode terminal 33 is not specially limited and any shapes may be adopted so long as they increase the adhesion with the electrical double layer capacitors and enable a solder fillet to be easily formed during mounting on a printed wiring board.

Figure 5A:
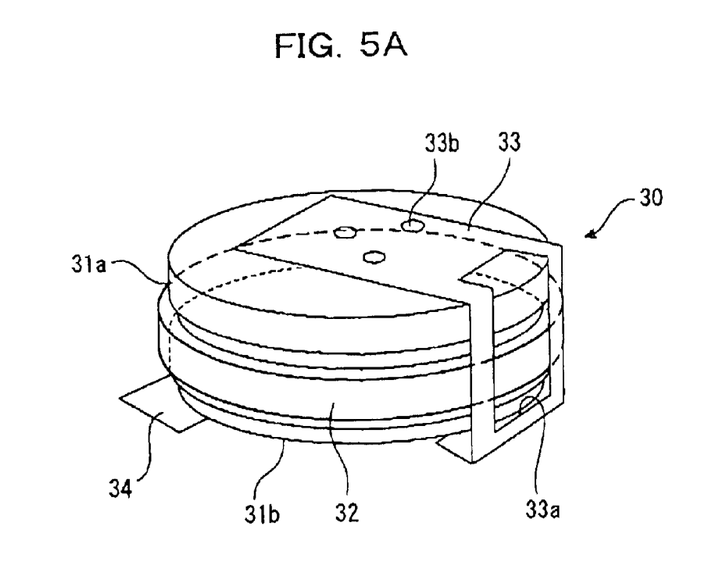
FIGS. 5A, 5B and 5C are a perspective view, a sectional view and a bottom plan view, respectively, showing a configuration of a storage cell for surface mounting according to Embodiment 3 of the invention.
Figure 5B:
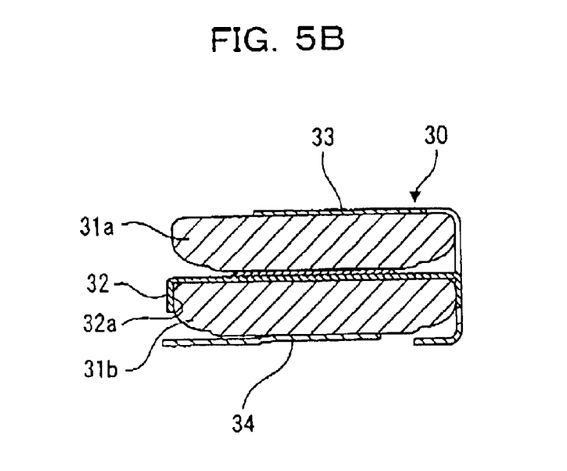
Figure 5C:
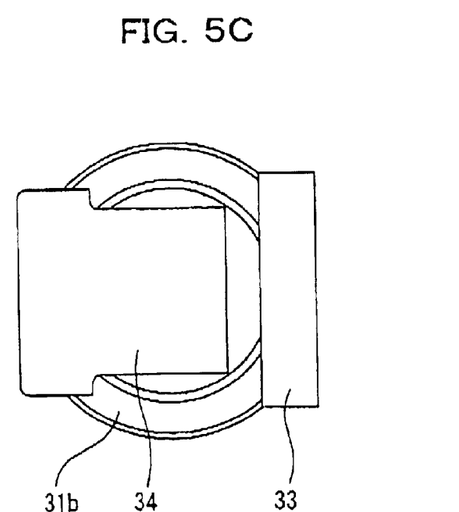
Figure 6:
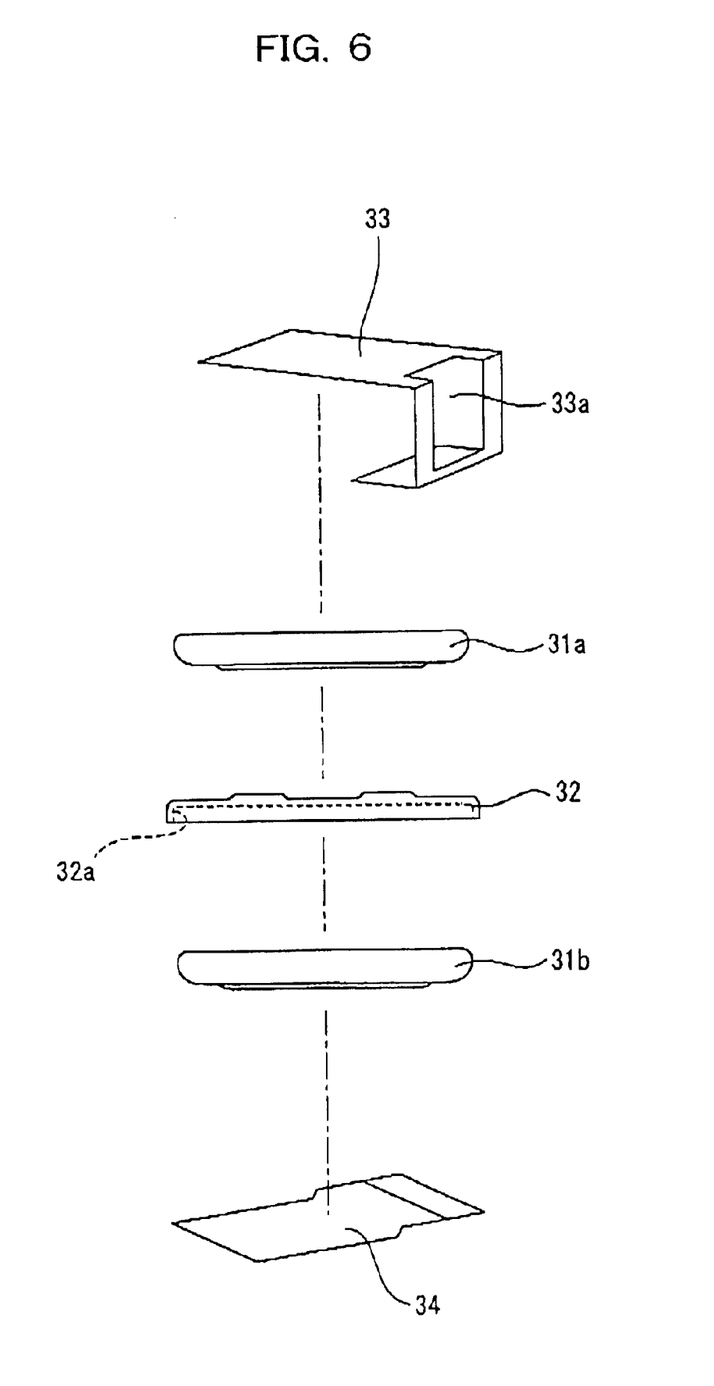
FIG. 6 is an exploded view showing the configuration of a storage cell according to Embodiment 3 of the invention.

The storage cell for surface mounting obtains a shape close to a square by forming the soldered parts of the anode terminal 33 and cathode terminal 34 so wide that both have almost the same width and, besides, the tensile movement of the product during the formation of a solder fillet can be held to a minimum by plating the soldered parts of the anode terminal 33 and cathode terminal 34 with tin or a tin alloy. Furthermore, it becomes possible to perform the inspection of the mounting state in image recognition after soldering with good accuracy.

Incidentally, the above descriptions were given by taking as an example a storage cell for surface mounting whose anode terminal 33 has a channel shape and whose cathode terminal has a rectangular shape. However, the present invention is not limited to this and similar effects can be obtained even in a case where the cathode terminal is bent into the channel shape and the anode terminal has the rectangular shape.

What is claimed is:

1. A storage cell for surface mounting, comprising:
   a polar storage cell having a component composed of a pair of electrodes and an insulative separator interposed between the pair of electrodes, the component being housed between a case disposed on an anode side of the component and a top cover disposed on a cathode side of the component and being sealed with an insulator;
   an anode terminal connected to an outer surface of said case; and
   a cathode terminal connected to an outer surface of said top cover;
   wherein the anode terminal is provided with an external connection connected to a printed wiring board, the cathode electrode is provided with an external connection connected to the printed wiring board and a mounting-fixing portion connected to the top cover, and a plated layer is formed on the external connections of the anode terminal and cathode terminal and on the mounting-fixing portion of the cathode terminal.

2. The storage cell for surface mounting according to claim 1, wherein the anode terminal and the cathode terminal are arranged so that the external connection formed by bending an end of the anode terminal and the external connection of the cathode terminal are positioned in parallel in a same direction.

3. The storage cell for surface mounting according to claim 1, wherein the mounting-fixing portion is positioned in a center of the top cover.

4. The storage cell for surface mounting according to claim 3, wherein a hole is cut out in a center of the mounting-fixing portion.

5. The storage cell for surface mounting according to claim 1, wherein the plated layer is a tin-plated layer.

6. A storage cell for surface mounting, comprising a plurality of polar storage cells laminated in series through a connection member,
wherein an end of an anode terminal and an end of a cathode terminal are connected respectively to an anode and a cathode that provide both ends of the laminated polar storage cells, and the other end of the anode terminal and the other end of the cathode terminal are disposed on a same plane.

7. The storage cell for surface mounting according to claim 6, wherein the connection member has a concave longitudinal sectional shape, the cathode of the polar storage cell is bonded to an outer bottom surface of the connection member, and the anode of the polar storage cell is bonded to at least part of an inner circumferential surface of the connection member.

8. The storage cell for surface mounting according to claim 6, wherein one of the anode terminal connected to the anode of the laminated polar storage cells and the cathode terminal connected to the cathode is substantially linear and the other is bent into a channel shape.

9. The storage cell for surface mounting according to claim 8, wherein an opening is formed in an area of the anode terminal or the cathode terminal bent in the channel shape, said area contacting with an outer peripheral surface of the polar storage cell.

* * * * *